United States Patent
Trandal et al.

(10) Patent No.: US 11,069,156 B2
(45) Date of Patent: Jul. 20, 2021

(54) SYSTEM AND METHOD FOR ESTIMATING REMAINING USEFUL LIFE OF PRESSURE COMPENSATOR

(71) Applicant: ABB Schweiz AG, Baden (CH)

(72) Inventors: Arne Trandal, Norge (NO); Markku Launonen, Vaasa (FI); Helge Kolstad, Norge (NO)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/957,875

(22) PCT Filed: Jan. 29, 2019

(86) PCT No.: PCT/EP2019/052034
§ 371 (c)(1),
(2) Date: Jun. 25, 2020

(87) PCT Pub. No.: WO2019/154666
PCT Pub. Date: Aug. 15, 2019

(65) Prior Publication Data
US 2020/0364948 A1    Nov. 19, 2020

(30) Foreign Application Priority Data
Feb. 6, 2018  (EP) ..................... 18155289

(51) Int. Cl.
*G07C 3/02*   (2006.01)
*G01B 11/14*  (2006.01)
(Continued)

(52) U.S. Cl.
CPC ............... *G07C 3/02* (2013.01); *G01B 7/14* (2013.01); *G01B 11/14* (2013.01); *G01B 21/16* (2013.01); *H05K 5/067* (2013.01); *H05K 5/068* (2013.01)

(58) Field of Classification Search
CPC . G07C 3/02; G01B 7/14; G01B 11/14; G01B 21/16; H05K 5/067; H05K 5/068
(Continued)

(56) References Cited

U.S. PATENT DOCUMENTS 6,658,843 B1 * 12/2003 Kauss ...................... B62D 5/07
                                                        60/421
8,725,429 B2    5/2014 McNeill et al.
(Continued)

FOREIGN PATENT DOCUMENTS

CN    101226078 A    7/2008
EP      1905552 A1   4/2008
(Continued)

OTHER PUBLICATIONS

Xingjian Wang, Siru Lin, Shaoping Wang, Zhaomin He, Chao Zhang, "Remaining useful life prediction based on the Wiener process for an aviation axial piston pump", Chinese Society of Aeronautics and Astronautics & Beihang University, Dec. 21, 2015.*

(Continued)

*Primary Examiner* — John H Le
(74) *Attorney, Agent, or Firm* — Whitmyer IP Group LLC

(57) ABSTRACT

A method for estimating the remaining useful life of a pressure compensator of a subsea arrangement, the method including determining displacement data related to displacements of the pressure compensator during a time period; and estimating the remaining useful life of the pressure compensator in relation to a failure mode of the pressure compensator based on the determined displacement data of the pressure compensator. A system including a subsea arrangement and a control system, a computer program product, and a computer program, are also provided.

20 Claims, 1 Drawing Sheet

(51) Int. Cl.
*G01B 7/14* (2006.01)
*G01B 21/16* (2006.01)
*H05K 5/06* (2006.01)

(58) Field of Classification Search
USPC .................. 702/34, 50, 55; 137/12; 138/30
See application file for complete search history.

(56) References Cited

U.S. PATENT DOCUMENTS

| | | | |
|---|---|---|---|
| 9,570,224 B2 * | 2/2017 | Kristensen | H05K 5/068 |
| 2003/0005486 A1 * | 1/2003 | Ridolfo | G05B 23/0272 |
| | | | 800/288 |
| 2013/0278377 A1 | 10/2013 | Slupsky et al. | |
| 2014/0048163 A1 * | 2/2014 | Brekke | G01B 11/14 |
| | | | 138/30 |
| 2015/0095100 A1 | 4/2015 | Vittal et al. | |
| 2016/0131164 A1 * | 5/2016 | Carpenter | F15B 19/005 |
| | | | 92/5 R |
| 2017/0055356 A1 | 2/2017 | Kristensen | |
| 2017/0066442 A1 | 3/2017 | Woodley | |

FOREIGN PATENT DOCUMENTS

| | | |
|---|---|---|
| EP | 2902584 A2 | 8/2015 |
| EP | 2925102 A1 | 9/2015 |
| GB | 2177290 A | 1/1987 |

OTHER PUBLICATIONS

International Preliminary Report on Patentability Application No. PCT/EP2019/052034 Completed: Jan. 29, 2020; dated Jan. 29, 2020 30 pages.

International Search Report and Written Opinion of the International Searching Authority Application No. PCT/EP2018/054211 Completed: Nov. 9, 2018; dated Nov. 21, 2018 8 pages.

Det Norske Veritas, "Riser Fatigue"; Recommended Practice DNV-RP-F204, Jul. 2005; Retrieved from the Web on Jun. 24, 2020 http://rules.dnvgl.com/docs/pdf/DNV/codes/docs/2005-07/RP-F204.pdf 34 pages.

* cited by examiner

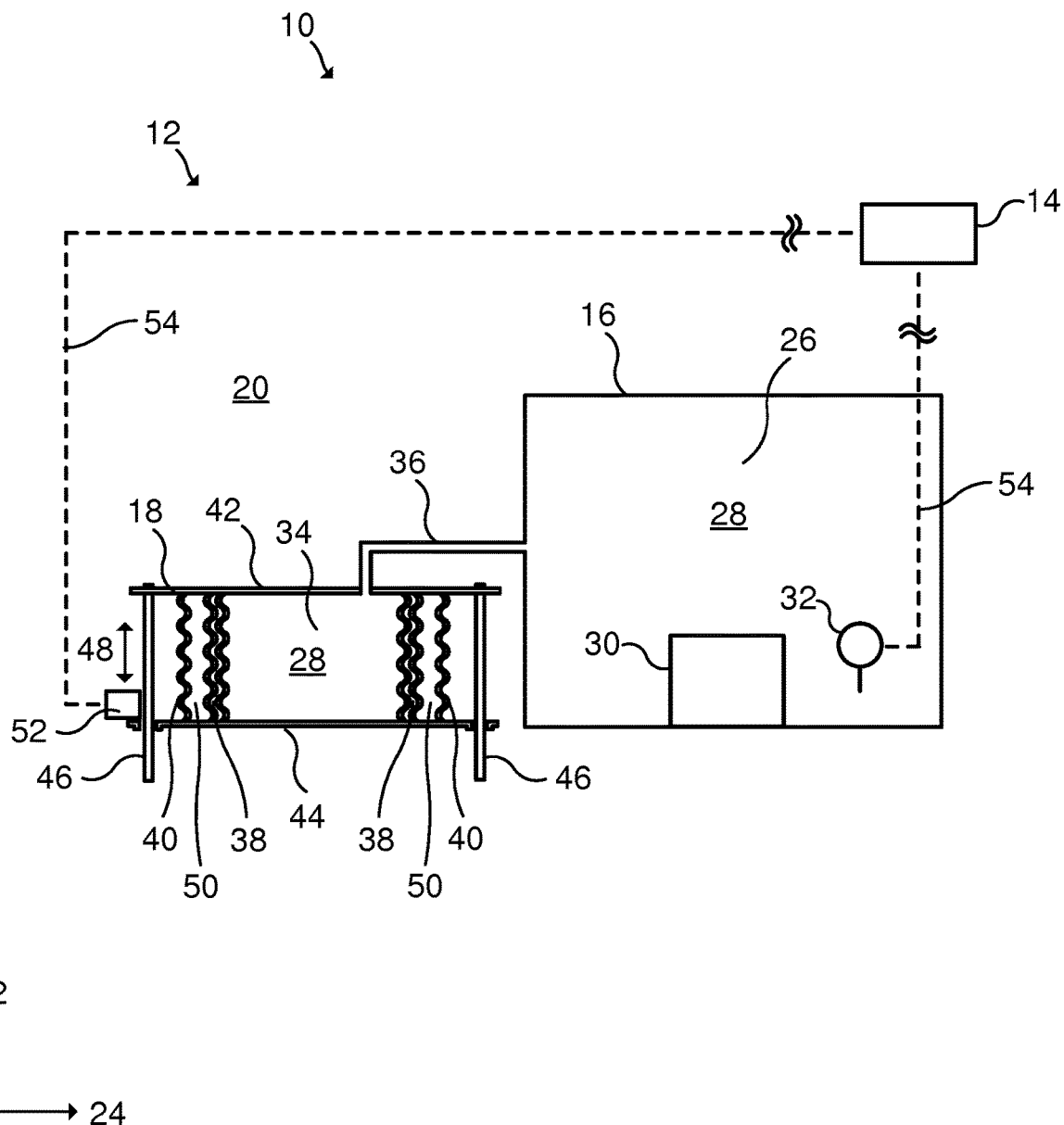

SYSTEM AND METHOD FOR ESTIMATING REMAINING USEFUL LIFE OF PRESSURE COMPENSATOR

TECHNICAL FIELD

The present disclosure generally relates to estimation of the remaining useful life of a pressure compensator of a subsea arrangement. In particular, a method for estimating the remaining useful life of a pressure compensator of a subsea arrangement, a system comprising a subsea arrangement and a control system, a computer program product, and a computer program, are provided.

BACKGROUND

Subsea arrangements housing power equipment under water, such as transformers or frequency converters, may comprise a vessel filled with insulation and/or cooling fluid to encounter for the high pressure due to great water depth. During operation of the subsea arrangement, temperature and consequently volume of the insulation and/or cooling fluid vary, whereby pressure compensation of the fluid is needed. This typically involves the use of a pressure compensator, which is in fluid connection with the vessel of the arrangement. The pressure compensator receives excess fluid when its temperature and volume increase, and returns the fluid back to the vessel when it cools down.

The repeated expansions and compressions of the pressure compensator expose the material of the pressure compensator to mechanical wear. After a certain time, the pressure compensator may be subjected to fatigue and a consequential risk of breakage.

One measure to prevent failure due to wear is to regularly inspect the pressure compensator. One type of prior art solution for monitoring the function of a pressure balanced oil filled enclosure is to visually inspect the compensator position by means of a remotely operated vehicle (ROV). If the compensator is not moving during pressure changes within the enclosure, this may be an indication of a failure. A further measure to avoid failure due to wear is to provide large design margins to the pressure compensators. Both these measures add significant costs.

EP 2925102 A1 discloses a method of detecting a failure in a pressure compensation system. A control unit may be adapted to determine the presence of a failure of first or second pressure compensator on the basis of a displacement measured with a first or second measuring unit. The first and second measuring units may comprise an inductive or an optical sensor to measure the displacement of the respective pressure compensator.

US 2017055356 A1 discloses a method of detecting a failure in a pressure compensation system, in which a group of pressure compensators compensate volume changes of a liquid in a chamber of a subsea device. By way of a control unit and controllable valves, it becomes possible to isolate a pressure compensator by closing the respective flow connection and to continue operation with a functioning pressure compensator. The control unit may be configured so as to maintain the first or the second pressure compensator in a standby mode in which the flow connection of the pressure compensator to the chamber is closed.

US 2013278377 A1 discloses a wireless sensor device or "mote" for attachment to a component of equipment or a structure for determining status and sensing one or more changes occurring at that component, such as strain, vibration, development of cracking, progression of cracking and temperature.

SUMMARY

One object of the present disclosure is to provide a simple, accurate and/or reliable condition monitoring of a pressure compensator of a subsea arrangement.

A further object of the present disclosure is to provide a simple, accurate and/or reliable prediction of when a pressure compensator of a subsea arrangement needs service, maintenance and/or replacement.

A still further object of the present disclosure is to provide a method for estimating the remaining useful life of a pressure compensator of a subsea arrangement.

A still further object of the present disclosure is to provide a method for estimating the remaining useful life of a pressure compensator of a subsea arrangement in a simple, accurate and/or reliable manner.

A still further object of the present disclosure is to provide a method for estimating the remaining useful life of a pressure compensator of a subsea arrangement that enables a reduced design margin of the subsea arrangement and/or the pressure compensator.

A still further object of the present disclosure is to provide a system comprising a subsea arrangement and a control system, which system solves one, several or all of the foregoing objects.

According to one aspect, there is provided a method for estimating the remaining useful life of a pressure compensator of a subsea arrangement, the method comprising determining displacement data related to displacements of the pressure compensator during a time period during normal operation; and estimating the remaining useful life of the pressure compensator in relation to a failure mode of the pressure compensator based on the determined displacement data of the pressure compensator.

A pressure compensator according to the present disclosure may comprise one, two or more barriers. The at least one pressure compensator may comprise, or may be constituted by, at least one metal bellows. Alternatively, or in addition, a pressure compensator according to the present disclosure may comprise two or more bellows arranged in series.

The pressure compensator may for example comprise an inner barrier defining a compensation volume and an outer barrier defining an intermediate volume between the inner barrier and the outer barrier. Thereby, the subsea arrangement can withstand breach of one barrier for a limited time without failing. The intermediate volume may be filled with the same type of internal fluid as in the main enclosure volume and in the compensation volume, i.e. a dielectric liquid such as dielectric oil. Alternatively, the intermediate volume and the compensation volume may respectively be filled with different types of dielectric insulation fluids. According to one example, the inner barrier is made of metal and the outer barrier is made of rubber.

The step of estimating the remaining useful life of the pressure compensator based on the determination of the displacement data may be carried out online. Thus, the estimation can be made simple and it may not be needed to, for example, visually inspect the pressure compensator with an ROV. A total useful life of the pressure compensator may also be estimated. In this case, the step of estimating the remaining useful life may comprise subtracting the used life from the estimated total useful life.

As used herein, displacement covers both axial movements and deflections, such as radial deflections, of the pressure compensator. The time period according to the present disclosure may span over the entire used life of the pressure compensator, e.g. from the start of operation of the subsea arrangement.

Throughout the present disclosure, the displacement data may comprise, or may be constituted by, displacement amplitudes of the pressure compensator, e.g. axial movements and/or radial deflections. Alternatively, or in addition, the displacement data may comprise, or may be constituted by, stresses in the pressure compensator. In some implementations of the subsea arrangement, the stresses in the pressure compensator can be approximated as a function of the volume changes of the compensation volume.

The method may further comprise obtaining temperature data related to average temperatures of an internal fluid in fluid communication with the pressure compensator during the time period; and the determination of the displacement data may be made based on the temperature data.

The average temperatures of the internal fluid may be calculated or measured in various ways. The temperature data may be obtained from one or more temperature sensors in the subsea arrangement. The average temperatures may for example be calculated based on measured temperature values at one or more points within a main enclosure volume and/or a pressure compensator volume. During operation of an electronic component arranged inside the main enclosure, the temperature of the internal fluid is typically higher in an upper part of the main enclosure volume and lower in a lower part of the main enclosure volume. The average temperature of the internal fluid may be correlated with the temperature in the upper part of the main enclosure. Alternatively, or in addition, the temperature data may be calculated based on the power supplied to the subsea arrangement. Throughout the present disclosure, the internal fluid may be constituted by an internal liquid, such as a dielectric liquid.

The temperature of the ambient seawater affects the temperature of the internal fluid in the pressure compensator. In most subsea arrangements, the temperature of the ambient seawater has larger impact on the temperature of the internal fluid in the pressure compensator than the temperature of the internal fluid in the main enclosure volume. Thus, the temperature of the seawater ambient to the pressure compensator may be taken into account when calculating the average temperature of the internal fluid.

The determination of the displacement data may comprise calculating a volume change of a compensation volume of the pressure compensator based on the temperature data. By knowing the total volume of the internal fluid and a thermal expansion coefficient of the internal fluid, the volume changes of the compensation volume can be accurately determined based on the average temperatures of the internal fluid.

The determination of the displacement data of the pressure compensator during the time period based on the temperature data may comprise providing a displacement model of the displacement data of the pressure compensator as a function of the temperature data; and determining the displacement data of the pressure compensator during the time period based on the temperature data and the displacement model.

In addition to the temperature data, the displacement model may further be based on depth data and/or configuration of the pressure compensator (e.g. barrier configuration, wall thickness(es) and stiffness). The step of determining the displacement data of the pressure compensator may comprise one or more simulations based on the displacement model.

The determination of the displacement data of the pressure compensator during the time period based on the temperature data may comprise determining the displacement data of the pressure compensator based on the obtained temperature data, historical temperature data and historical displacement data. The historical temperature data and the historical displacement data may for example be comprised by historical test data or historical real operation data.

The method may further comprise obtaining displacement values from a displacement sensor related to displacements of the pressure compensator during the time period; and the determination of the displacement data may be made based on the displacement values. The displacement sensor may be configured to measure movements, positions, or both movements and positions, of the pressure compensator.

The determination of the displacement data may comprise determining or obtaining displacement values of the pressure compensator, filtering the displacement values, and determining the displacement data based on the filtered displacement values. The displacement values may be determined based on obtained or calculated temperature data related to average temperature of the internal fluid in fluid communication with the pressure compensator. The displacement values may be obtained by means of the displacement sensor. The filtering may be made in various ways, for example by means of a rainflow counting algorithm.

The estimation of the remaining useful life of the pressure compensator based on the determined displacement data of the pressure compensator may comprise providing a compensator lifetime model for estimating the remaining useful life as a function of the displacement data of the pressure compensator; and estimating the remaining useful life of the pressure compensator based on the compensator lifetime model. In case fatigue is used as the failure mode, the compensator lifetime model may be constituted by a fatigue model. The estimation of the remaining useful life of the pressure compensator may alternatively be based on simulations and/or historical data (e.g. of previously failed pressure compensators).

The compensator lifetime model may further be based on depth data of the pressure compensator. Depth data according to the present disclosure may comprise, or may be constituted by, a sea depth of the pressure compensator, temperature and/or hydrostatic pressure of ambient seawater outside of the pressure compensator. When high hydrostatic pressures in the ambient seawater act on a pressure compensator comprising more than one barrier, or ply, the barriers may be pushed against each other. As a consequence, the flexibility and the remaining useful life of the pressure compensator will be affected. By taking into account depth data, such as hydrostatic pressure or seawater depth, in the method, the remaining useful life of the pressure compensator can be estimated more accurately.

The deflection cycles of the pressure compensator consist of testing time cycles, transport cycles, storing time cycles as well as operational time cycles at a given water depth (hydrostatic pressure). Such cycle modes may be repeated several times e.g. in case the equipment is moved to another location.

A first pressure compensator with two barriers of a first thickness in contact with each other has a longer lifetime (under the same conditions) than a second pressure compensator with only a single barrier having a second thickness that is twice the first thickness. In this case, the first pressure compensator has a higher endurance against cycling movements. However, at increasing hydrostatic pressures, the life of the first pressure compensator is reduced and thereby approaches the life of the second pressure compensator.

At great depths, the temperature of the ambient seawater is practically constant. In these cases, the temperature of the ambient seawater may be approximated as constant in the depth data of the compensator lifetime model.

The method may further comprise determining a failure mode of the pressure compensator relating to the pressure compensator; and the estimation of the remaining useful life of the pressure compensator may be carried out in relation to the failure mode of the pressure compensator. Examples of failure modes according to the present disclosure includes fatigue, failure and other performance reductions of the pressure compensator.

According to a further aspect, there is provided a system comprising a subsea arrangement and a control system, wherein the subsea arrangement comprises a main enclosure having a main enclosure volume; and at least one pressure compensator having a variable compensation volume in fluid communication with the main enclosure volume and configured to compensate volume variations of an internal fluid in the main enclosure volume; wherein the control system is configured to determine displacement data related to displacements of the pressure compensator during a time period during normal operation; and estimate the remaining useful life of the pressure compensator in relation to a failure mode of the pressure compensator based on the determined displacement data of the pressure compensator. The subsea arrangement may comprise at least one electronic component arranged inside the main enclosure. The subsea arrangement may comprise the control system. In this case, the system may be constituted by the subsea arrangement.

The at least one main pressure compensator is configured to balance the pressure in the main enclosure to the pressure prevailing in an ambient seawater. The main enclosure thus constitutes a pressurized or pressure compensated enclosure or vessel. A slight overpressure with respect to the ambient seawater may be provided in the main enclosure. In this way, the risk for ambient seawater entering the main enclosure volume is further reduced. The overpressure in the main enclosure may for example be accomplished by means of one or more springs exerting a biasing force on the main pressure compensator.

The internal fluid in the main enclosure volume (and in the compensation volume) may be constituted by a cooling liquid and/or a dielectric liquid, e.g. a dielectric oil. The subsea arrangement according to the present disclosure may be used for a wide range of subsea implementation. As one example, the subsea arrangement may be used in subsea oil and gas extraction. A further possible implementation is subsea mining.

The subsea arrangement may further comprise at least one temperature sensor arranged to measure a temperature of the internal fluid; and the 3o control system may be configured to obtain temperature data related to average temperatures of the internal fluid from the temperature sensor during the time period; and determine the displacement data based on the temperature data.

The subsea arrangement may further comprise power equipment housed within the main enclosure. Examples of power equipment include transformers, switchgears, variable speed drives (VSD), high voltage conductors and combinations thereof.

The at least one temperature sensor may be provided in the main enclosure. Thus, the at least one temperature sensor may be constituted by an internal temperature sensor. As an alternative, the at least one temperature sensor may be provided in the compensation volume.

According to a further aspect, there is provided a computer program product comprising a computer readable means holding computer-executable components for causing a control system to perform any of the methods according to the present disclosure.

According to a further aspect, there is provided a computer program comprising computer program code which is able to, when run on processor circuitry of a control system, cause the control system to perform any of the methods according to the present disclosure.

BRIEF DESCRIPTION OF THE DRAWINGS

Further details, advantages and aspects of the present disclosure will become apparent from the following embodiments taken in conjunction with the drawings, wherein:

FIG. 1: schematically represents a side view of a system comprising a subsea arrangement and a control system.

DETAILED DESCRIPTION

In the following, a method for estimating the remaining useful life of a pressure compensator of a subsea arrangement, a system comprising a subsea arrangement and a control system, a computer program product and a computer program, will be described. The same reference numerals will be used to denote the same or similar structural features.

FIG. 1 schematically represents a side view of a system 10 comprising a subsea arrangement 12 and a control system 14. The subsea arrangement 12 comprises a main enclosure 16 and a pressure compensator 18. In this example, the subsea arrangement 12 comprises one pressure compensator 18 but the subsea arrangement 12 may alternatively comprise several pressure compensators 18. The subsea arrangement 12 is submerged in ambient seawater 20. FIG. 1 further indicates a vertical direction 22 and a horizontal direction 24.

The main enclosure 16 comprises a main enclosure volume 26. The main enclosure volume 26 may for example be constituted by one continuous chamber or by several chambers in fluid communication with each other. The main enclosure volume 26 is filled with an internal fluid 28, such as a dielectric oil. Power equipment 30 is arranged within the main enclosure volume 26. Non-limiting examples of power equipment 30 include transformers, switchgears, variable speed drives (VSD), high voltage conductors and combinations thereof. Heat from the power equipment 30 is absorbed by the internal fluid 28.

The subsea arrangement 12 further comprises at least one temperature sensor 32 arranged to measure a temperature of the internal fluid 28. In this example, the temperature sensor 32 is arranged inside the main enclosure 16.

The pressure compensator 18 has a variable compensation volume 34 in fluid communication with the main enclosure volume 26. Thus, also the compensation volume 34 is filled with the internal fluid 28. The pressure compensator 18 is configured to compensate for volume variations of the internal fluid 28, e.g. a volume expansion of the internal fluid 28 due to heating by the power equipment 30. The temperature sensor 32 may alternatively be arranged in the compensation volume 34.

In the example of FIG. 1, the fluid communication is realized by means of a pipe arrangement 36 between the main enclosure 16 and the pressure compensator 18. The pipe arrangement 36 may be flexible and/or comprise flexible components to compensate for movements of the pressure compensator 18.

The pressure compensator 18 of this example comprises an inner barrier 38 and an outer barrier 40. In FIG. 1, the inner barrier 38 is constituted by a double wall metal bellows and the outer barrier 40 is constituted by a rubber bellows or rubber enclosure. The two walls of the inner barrier 38 may be made of flexible metal sheets and air with a pressure of approximately 1 bar may be provided between the two sheets. The outer barrier 40 may be provided with a strengthening material on its inside. The provision of two barriers improves reliability of the pressure compensator 18.

The pressure compensator 18 further comprises an upper end plate 42 and a lower end plate 44. Each of the upper end plate 42 and the lower end plate 44 may be made of metal. The inner barrier 38, the upper end plate 42 and the lower end plate 44 define the compensation volume 34 of the pressure compensator 18. The upper end plate 42 is guided up and down in the vertical direction 22 by means of guiding rods 46 as illustrated by arrows 48.

During normal operation of the subsea arrangement 12, the pressure compensator 18 is displaced, i.e. contracts and expands, according to the volume changes of the internal fluid 28. In this example, the lower end plate 44 of the pressure compensator 18 is stationary and the displacement of the pressure compensator 18 is effected by the movements of the upper end plate 42 in directions 48. However, the pressure compensator 18 may have an alternative orientation in space or the displacement of the pressure compensator 18 may additionally take place in the horizontal direction 24 (radial deflection), or in any other direction.

A closed intermediate volume 50 is formed between the inner barrier 38 and the outer barrier 40. The intermediate volume 50 is also filled with the internal fluid 28. However, the intermediate volume 50 may alternatively be filled with another fluid or a vacuum may be established in the intermediate volume 50. Due to the elasticity of the outer barrier 40, the pressure of the internal fluid 28 within the intermediate volume 50 is substantially the same as the pressure of the ambient seawater 20 outside the pressure compensator 18.

The present disclosure is not limited to the particular type of pressure compensator 18 shown in FIG. 1. Alternative types of pressure compensators according to the present disclosure include pressure compensators comprising only one barrier and/or pressure compensators connected in series.

The subsea arrangement 12 may be installed at great depth, for example at 3000 m (hydrostatic pressure of 300 bars). At great depths, the hydrostatic pressure acting on the pressure compensator 18 is practically constant. The volume change of the internal fluid 28 can thereby be accurately calculated based on the average temperature. Furthermore, the axial displacement of the pressure compensator 18 can be accurately calculated based on the volume change of the internal fluid 28. Thus, the average temperatures of the internal fluid 28 within the main enclosure volume 26 accurately and reliably correspond to axial displacements of the pressure compensator 18. The main enclosure volume 26 may be substantially larger than the compensation volume 34. In the example of FIG. 1, the main enclosure volume 26 is approximately ten times larger than the compensation volume 34.

When the hydrostatic pressure increases due to a greater seawater depth, the inner barrier 38 and the outer barrier 40 may be brought into contact. When the hydrostatic pressure increases further, the rigidity of the inner barrier 38 and the outer barrier 40 increases. As a consequence, the lifetime of a pressure compensator 18 comprising two barriers 38, 40 may be shorter at greater seawater depths.

The subsea arrangement 12 of this example further comprises a displacement sensor 52. The displacement sensor 52 is configured to detect displacements, such as positions and/or movements, of the pressure compensator 18, for example by detecting positions and/or movements of the upper end plate 42 relative to the lower end plate 44. The displacement sensor 52 may comprise, or may be constituted by, an optical sensor, an inductive sensor or the like.

The subsea arrangement 12 may comprise only the temperature sensor 32, only the displacement sensor 52, both the temperature sensor 32 and the displacement sensor 52. Alternatively, the subsea arrangement 12 comprises neither the temperature sensor 32 nor the displacement sensor 52. In the latter case, the displacement data can be determined based on pressure measurements and/or based on the supplied power to the subsea arrangement 12, for example based on supplied power versus time and known thermal time constants of the subsea arrangement 12. The thermal time constants may be several hours, or even days.

In the example of FIG. 1, the control system 14 is in signal communication with the temperature sensor 32 and the displacement sensor 52 by means of signal lines 54. However, a wireless communication may alternatively be implemented.

The control system 14 is configured to determine displacement data related to displacements of the pressure compensator 18 during a time period. The control system 14 may further be configured to estimate or predict the remaining useful life of the pressure compensator 18 in relation to a failure mode of the pressure compensator 18 based on the determined displacement data of the pressure compensator 18. Alternatively, the estimation of the remaining useful life of the pressure compensator 18 based on the determination of the displacement data may be carried out online.

Various methods for determining the number of oscillation cycles until failure (or other defined failure mode) of the pressure compensator 18 are applicable. One example of such method is the Miner's rule.

The displacement data may be determined based on temperature data related to average temperatures of the internal fluid 28. The average temperatures may be obtained from, or determined based on, temperatures measured by the temperature sensor 32. Alternatively, or in addition, the average temperatures may be determined based on the power supplied to the subsea arrangement 12, such as to the power equipment 30.

By knowing the thermal expansion coefficient of the internal fluid 28 and temperature data related to average temperatures of the internal fluid 28 during the time period, volume changes of the internal fluid 28 can be calculated during the time period. By also knowing the volumes of the main enclosure volume 26 and the compensation volume 34, volume changes of the pressure compensator 18 can also be calculated. The thermal expansion coefficient of the internal fluid 28 is often given by the supplier. The thermal expansion coefficient may alternatively be calculated or may be set to a fixed value.

The displacement of the pressure compensator 18 is proportional to the volume change of the compensation volume 34 and also to the volume change of the internal fluid 28 in the main enclosure volume 26 and in the compensation volume 34. Any given temperature of the internal fluid 28 will correspond to a given volume of the internal fluid 28 during normal operation of the subsea arrangement 12.

The determination of the displacement data of the pressure compensator 18 during the time period based on the temperature data may be based on a displacement model. The displacement model may express displacement data of the pressure compensator 18 as a function of the average temperatures of the internal fluid 28 during the time period. The displacement data of the pressure compensator 18 can thereby be determined based on the temperature data and the displacement model.

The volume change of the internal fluid 28 within the main enclosure volume 26 and the compensation volume 34 is directly proportional to the change of average temperature of the internal fluid 28 within the main enclosure volume 26 and the compensation volume 34. In the example of FIG. 1, the pressure compensator 18 expands and compresses axially as indicated by arrows 48. A certain volume change of the internal fluid 28 thereby generates a certain axial displacement of the pressure compensator 18. Thus, the axial displacement of the pressure compensator 18 is directly proportional to the average temperature of the internal fluid 28.

If the subsea arrangement 12 alternatively comprises a pressure compensator with only a rubber barrier, e.g. without the inner barrier 38 of metal, the pressure compensator may displace both axially and radially. The lifetime of such pressure compensator can be defined by temperature induced volume variations of the internal fluid 28.

As an alternative, the determination of the displacement data of the pressure compensator 18 during the time period based on the temperature data may comprise determining displacement data of the pressure compensator 18 based on the temperature data (obtained from the temperature sensor 32 or calculated based on the power supply), historical temperature data and historical displacement data.

Alternatively, or in addition, the displacement data may be determined based on displacement values of the pressure compensator 18 obtained from the displacement sensor 52. The displacement sensor 52 may for example provide positional data of the pressure compensator 18 relative to a neutral position of the pressure compensator 18.

In any case, the displacement values (e.g. amplitudes determined based on the power supply, amplitudes determined based on temperature data from the temperature sensor 32, and/or amplitudes obtained from the displacement sensor 52) may be filtered. Thereby, the displacement data may be constituted by a simplified set of displacement values and the displacement data for use when estimating the remaining useful life of the pressure compensator 18 may be based on the filtered and simplified displacement values. The filtering of amplitudes may for example be made with an algorithm, such as a rainflow counting algorithm. One example of a rainflow counting algorithm is the ASTM standard E 1049-85. A model of damage of the pressure compensator 18 as a function of a simple set of amplitudes can be found by tests.

A compensator lifetime model may be provided for estimating the remaining useful lifetime as a function of the displacement data of the pressure compensator 18. The compensator lifetime model may optionally comprise sea depth of the pressure compensator 18, temperature and/or hydrostatic pressure of ambient seawater 20 outside of the pressure compensator 18. The estimation of the remaining useful life of the pressure compensator 18 in relation to a failure mode of the pressure compensator 18 may then be made based on the compensator lifetime model.

The failure mode of the pressure compensator 18 may be defined in various ways. One example of a failure mode is fatigue of the pressure compensator 18, or a defined number of oscillations of the pressure compensator 18 prior to fatigue, or a defined time prior to fatigue of the pressure compensator 18.

The control system 14 may contain or may be loaded with a computer program product comprising a computer readable means holding computer-executable components for causing the control system 14 to perform methods according to the present disclosure. The computer program product may comprise a computer program comprising computer program code which, when run on a processor circuitry of the control system 14, causes the control system 14 to perform the methods.

While the present disclosure has been described with reference to exemplary embodiments, it will be appreciated that the present invention is not limited to what has been described above. For example, it will be appreciated that the dimensions of the parts may be varied as needed. Accordingly, it is intended that the present invention may be limited only by the scope of the claims appended hereto.

The invention claimed is:

1. A method for estimating the remaining useful life of a pressure compensator of a subsea arrangement, the method comprising:
    determining displacement data related to displacements of the pressure compensator during a time period during normal operation; and
    estimating the remaining useful life of the pressure compensator in relation to a failure mode of the pressure compensator based on the determined displacement data of the pressure compensator;
    wherein the estimation of the remaining useful life of the pressure compensator based on the determined displacement data of the pressure compensator includes:
    providing a compensator lifetime model for estimating the remaining useful life as a function of the displacement data of the pressure compensator; and
    estimating the remaining useful life of the pressure compensator based on the compensator lifetime model.

2. The method according to claim 1, wherein the method further comprises obtaining temperature data related to average temperatures of an internal fluid in fluid communication with the pressure compensator during the time period; and wherein the determination of the displacement data is made based on the temperature data.

3. The method according to claim 2, wherein the determination of the displacement data includes calculating a volume change of a compensation volume of the pressure compensator based on the temperature data.

4. The method according to claim 3, wherein the determination of the displacement data of the pressure compensator during the time period based on the temperature data comprises:
    providing a displacement model of the displacement data of the pressure compensator as a function of the temperature data; and
    determining the displacement data of the pressure compensator during the time period based on the temperature data and the displacement model.

5. The method according to claim 2, wherein the determination of the displacement data of the pressure compensator during the time period based on the temperature data comprises:

providing a displacement model of the displacement data of the pressure compensator as a function of the temperature data; and determining the displacement data of the pressure compensator during the time period based on the temperature data and the displacement model.

6. The method according to claim 2, wherein the determination of the displacement data of the pressure compensator during the time period based on the temperature data comprises:

determining the displacement data of the pressure compensator based on the obtained temperature data, historical temperature data and historical displacement data.

7. The method according to claim 2, wherein the method further comprises obtaining displacement values from a displacement sensor related to displacements of the pressure compensator during the time period; and wherein the determination of the displacement data is made based on the displacement values.

8. The method according to claim 2, wherein the determination of the displacement data includes determining or obtaining displacement values of the pressure compensator, filtering the displacement values, and determining the displacement data based on the filtered displacement values.

9. The method according to claim 2, further comprising determining a failure mode of the pressure compensator relating to the pressure compensator; and wherein the estimation of the remaining useful life of the pressure compensator is carried out in relation to the failure mode of the pressure compensator.

10. The method according to claim 1, wherein the method further comprises obtaining displacement values from a displacement sensor related to displacements of the pressure compensator during the time period; and wherein the determination of the displacement data is made based on the displacement values.

11. The method according to claim 1, wherein the determination of the displacement data includes determining or obtaining displacement values of the pressure compensator, filtering the displacement values, and determining the displacement data based on the filtered displacement values.

12. The method according to claim 1, wherein the compensator lifetime model is further based on depth data of the pressure compensator.

13. The method according to claim 1, further comprising determining a failure mode of the pressure compensator relating to the pressure compensator; and wherein the estimation of the remaining useful life of the pressure compensator is carried out in relation to the failure mode of the pressure compensator.

14. A system comprising a subsea arrangement and a control system, wherein the subsea arrangement includes:

a main enclosure having a main enclosure volume; and at least one pressure compensator having a variable compensation volume in fluid communication with the main enclosure volume and configured to compensate volume variations of an internal fluid in the main enclosure volume;

wherein the control system is configured to:

determine displacement data related to displacements of the pressure compensator during a time period during normal operation; and estimate the remaining useful life of the pressure compensator in relation to a failure mode of the pressure compensator based on the determined displacement data of the pressure compensator, wherein the estimation of the remaining useful life of the pressure compensator based on the determined displacement data of the pressure compensator includes providing a compensator lifetime model for estimating the remaining useful life as a function of the displacement data of the pressure compensator, and estimating the remaining useful life of the pressure compensator based on the compensator lifetime model.

15. The system according to claim 14, wherein the subsea arrangement further comprises at least one temperature sensor arranged to measure a temperature of the internal fluid; and wherein the control system is configured to:

obtain temperature data related to average temperatures of the internal fluid from the temperature sensor during the time period; and determine the displacement data based on the temperature data.

16. The system according to claim 15, wherein the at least one temperature sensor is provided in the main enclosure.

17. The system according to claim 15, wherein in the determination of the displacement data, the control system is configured to calculate a volume change of a compensation volume of the pressure compensator based on the temperature data.

18. The system according to claim 14, wherein the subsea arrangement further comprises a displacement sensor arranged to measure displacements of the pressure compensator during the time period; and wherein the control system is configured to obtain displacement values from the displacement sensor and determine the displacement data based on the displacement values.

19. A computer program product comprising a computer readable means holding computer-executable components for causing a control system to perform a method including:

determining displacement data related to displacements of the pressure compensator during a time period during normal operation; and estimating the remaining useful life of the pressure compensator in relation to a failure mode of the pressure compensator based on the determined displacement data of the pressure compensator;

wherein the estimation of the remaining useful life of the pressure compensator based on the determined displacement data of the pressure compensator includes:

providing a compensator lifetime model for estimating the remaining useful life as a function of the displacement data of the pressure compensator; and estimating the remaining useful life of the pressure compensator based on the compensator lifetime model.

20. A computer program comprising computer program code which is able to, when run on processor circuitry of a control system, cause the control system to perform a method including:

determining displacement data related to displacements of the pressure compensator during a time period during normal operation; and estimating the remaining useful life of the pressure compensator in relation to a failure mode of the pressure compensator based on the determined displacement data of the pressure compensator;

wherein the estimation of the remaining useful life of the pressure compensator based on the determined displacement data of the pressure compensator includes:

providing a compensator lifetime model for estimating the remaining useful life as a function of the displacement data of the pressure compensator; and estimating the remaining useful life of the pressure compensator based on the compensator lifetime model.

* * * * *